(12) United States Patent
Filippov et al.

(10) Patent No.: US 10,851,626 B2
(45) Date of Patent: Dec. 1, 2020

(54) SYSTEM AND METHOD TO REDUCE FLUID PRODUCTION FROM A WELL

(71) Applicant: Landmark Graphics Corporation, Houston, TX (US)

(72) Inventors: Andrey Filippov, Houston, TX (US); Vitaly Khoriakov, Calgary (CA); Mohamed Y. Soliman, Cypress, TX (US)

(73) Assignee: Landmark Graphics Corporation, Houston, TX (US)

( * ) Notice: Subject to any disclaimer, the term of this patent is extended or adjusted under 35 U.S.C. 154(b) by 355 days.

(21) Appl. No.: 15/739,702

(22) PCT Filed: Jul. 31, 2015

(86) PCT No.: PCT/US2015/043272
§ 371 (c)(1),
(2) Date: Dec. 23, 2017

(87) PCT Pub. No.: WO2017/023278
PCT Pub. Date: Feb. 9, 2017

(65) Prior Publication Data
US 2018/0187530 A1      Jul. 5, 2018

(51) Int. Cl.
| E21B 43/12 | (2006.01) |
| G06F 30/20 | (2020.01) |
| E21B 34/08 | (2006.01) |
| E21B 43/00 | (2006.01) |
| E21B 47/00 | (2012.01) |
| G06F 17/11 | (2006.01) |

(52) U.S. Cl.
CPC ............ *E21B 43/12* (2013.01); *E21B 34/08* (2013.01); *E21B 43/00* (2013.01); *E21B 47/00* (2013.01); *G06F 17/11* (2013.01); *G06F 30/20* (2020.01)

(58) Field of Classification Search
None
See application file for complete search history.

(56) References Cited

U.S. PATENT DOCUMENTS

| 6,112,817 | A | 9/2000 | Voll et al. |
| 6,595,294 | B1 | 7/2003 | Dalsmo et al. |
| 7,823,645 | B2 * | 11/2010 | Henriksen ............... E21B 34/08 |
| | | | 166/313 |

(Continued)

FOREIGN PATENT DOCUMENTS

| WO | 2011020998 A2 | 2/2011 |
| WO | 2015016932 A1 | 2/2015 |
| WO | 2015031519 A1 | 3/2015 |

OTHER PUBLICATIONS

PCT International Search Report and Written Opinion dated Apr. 25, 2016, issued in corresponding application No. PCT/US2015/043272 filed on Jul. 31, 2015, 13 pgs.

(Continued)

*Primary Examiner* — Bijan Mapar
(74) *Attorney, Agent, or Firm* — Chamberlain Hrdlicka

(57) ABSTRACT

A method to reduce fluid production in a well includes performing a production simulation of a reservoir model comprising a production tool with an inflow control device, and determining a parameter for the inflow control device to reduce fluid production through the inflow control device based upon the production simulation.

16 Claims, 7 Drawing Sheets

(56) References Cited

U.S. PATENT DOCUMENTS

| | | | |
|---|---|---|---|
| 7,870,906 B2 * | 1/2011 | Ali | E21B 34/08 166/320 |
| 8,527,100 B2 | 9/2013 | Russell et al. | |
| 2010/0051280 A1 | 3/2010 | Akram | |
| 2012/0278053 A1 * | 11/2012 | Garcia | E21B 43/12 703/10 |
| 2016/0177674 A1 * | 6/2016 | Shetty | G06F 17/16 703/10 |

OTHER PUBLICATIONS

A. Sharma et al., Integration of Dynamic Modeling of ICD Completion Design and Well Placement Technology: A Case Study of GOM Shelf Reservoir, SPE 146454, Oct. 30-Nov. 2, 2011, Society of Petroleum Engineers.

Hojeen Su and Ali H. Dogru, Modeling of Equalizer Production System and Smart Well Applications in Full-Field Studies, SPE 111288, Oct. 28-31, 2007, Society of Petroleum Engineers, Abu Dhabi, UAE, AE.

Kim Thornton et al., Optimization of Inflow Control Device Placement and MEchanical Conformance Decisions Using a New Coupled Well-Intervention Simulator, SPE 162471, Nov. 11-14, 2012, Society of Petroleum Engineers, Abu Dhabi, UAE.

P. Sarma, K. Aziz, L.J. Durolfsky, Implementation of Adjoint Solution for Optimal Control of Smart Wells, SPE 92864, Jan. 31, 2005-Feb. 2, 2005, Society of Petroleum Engineers Inc., Houston, TX, US.

Sule Gurses and Adam Vasper, Optimized Modeling Workflows for Designing Passive Flow Control Devices in Horizontal Wells, SPE 166052, Sep. 16-18, 2013, Society of Petroleum Engineers, Abu Dhabi, UAE.

* cited by examiner

SYSTEM AND METHOD TO REDUCE FLUID PRODUCTION FROM A WELL

BACKGROUND

This section is intended to introduce the reader to various aspects of art that may be related to various aspects of the presently described embodiments. This discussion is believed to be helpful in providing the reader with background information to facilitate a better understanding of the various aspects of the described embodiments. Accordingly, it should be understood that these statements are to be read in this light and not as admissions of prior art.

This disclosure relates generally to equipment utilized and operations performed in conjunction with a subterranean well and, in an example described below, more particularly provides a method for determining one or more design parameters for an inflow control device.

In a hydrocarbon production well, it is many times beneficial to be able to regulate flow of fluids from an earth formation into a wellbore, from the wellbore into the formation, and within the wellbore. A variety of purposes may be served by such regulation, including prevention of water or gas coning, minimizing sand production, minimizing water and/or gas production, maximizing oil production, balancing production among zones, transmitting signals, etc.

Therefore, it will be appreciated that advancements in the art of variably restricting fluid flow in a well would be desirable in the circumstances mentioned above, and such advancements would also be beneficial in a wide variety of other circumstances.

BRIEF DESCRIPTION OF THE DRAWINGS

For a detailed description of the embodiments of the invention, reference will now be made to the accompanying drawings in which.

Further.

The illustrated figures are only exemplary and are not intended to assert or imply any limitation with regard to the environment, architecture, design, or process in which different embodiments may be implemented.

DETAILED DESCRIPTION

Figure 1:
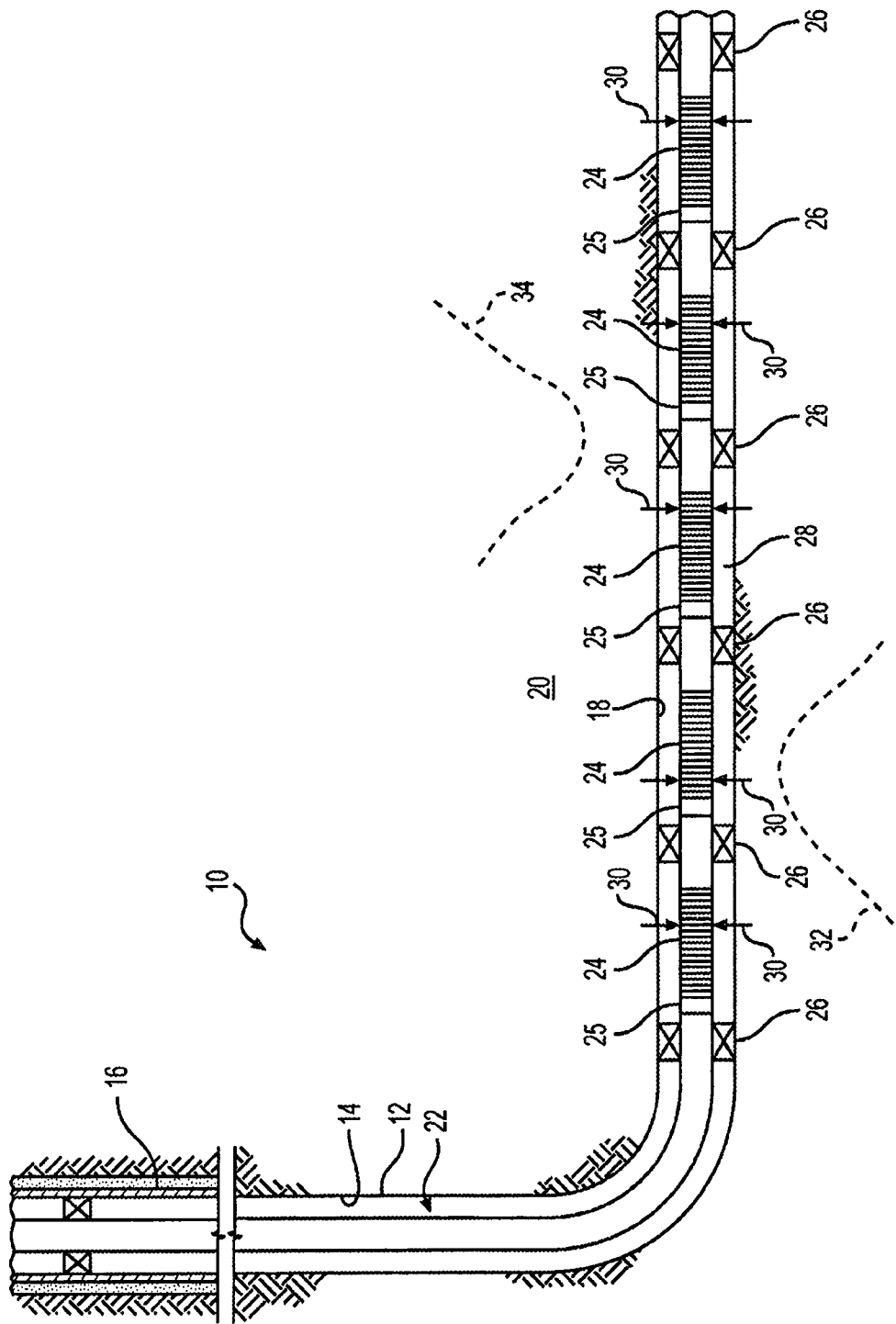
FIG. 1 shows schematic view of a well system including one or more inflow control devices in accordance with one or more embodiments of the present disclosure.

Turning now to the present figures, FIG. 1 shows a well system 10 that can embody principles of the present disclosure. As depicted in FIG. 1, a wellbore 12 has a generally vertical uncased section 14 extending downwardly from casing 16, as well as a generally horizontal uncased section 18 extending through an earth formation 20.

A tubular string 22 (such as a production tubing string) is installed in the wellbore 12. Interconnected in the tubular string 22 are multiple well screens 24, variable flow resistance systems 25 (e.g., inflow control devices), and packers 26. The packers 26 seal off an annulus 28 formed radially between the tubular string 22 and the wellbore section 18. In this manner, fluids 30 may be produced from multiple intervals or zones of the formation 20 via isolated portions of the annulus 28 between adjacent pairs of the packers 26.

Positioned between each adjacent pair of the packers 26, a well screen 24 and a variable flow resistance system 25 are interconnected in the tubular string 22. The well screen 24 filters the fluids 30 flowing into the tubular string 22 from the annulus 28. The variable flow resistance system 25 variably restricts flow of the fluids 30 into the tubular string 22, based on certain characteristics of the fluids.

At this point, it should be noted that the well system 10 is illustrated in the drawings and is described herein as merely one example of a wide variety of well systems in which the principles of this disclosure can be utilized. It should be clearly understood that the principles of this disclosure are not limited at all to any of the details of the well system 10, or components thereof, depicted in the drawings or described herein.

For example, it is not necessary in keeping with the principles of this disclosure for the wellbore 12 to include a generally vertical wellbore section 14 or a generally horizontal wellbore section 18. It is not necessary for fluids 30 to be only produced from the formation 20 since, in other examples, fluids could be injected into a formation, fluids could be both injected into and produced from a formation, etc. Further, it is not necessary for one each of the well screen 24 and variable flow resistance system 25 to be positioned between each adjacent pair of the packers 26. It is not necessary for a single variable flow resistance system 25 to be used in conjunction with a single well screen 24. Any number, arrangement and/or combination of these components may be used.

It is not necessary for any variable flow resistance system 25 to be used with a well screen 24. For example, in injection operations, the injected fluid could be flowed through a variable flow resistance system 25, without also flowing through a well screen 24.

It is not necessary for the well screens 24, variable flow resistance systems 25, packers 26 or any other components of the tubular string 22 to be positioned in uncased sections 14, 18 of the wellbore 12. Any section of the wellbore 12 may be cased or uncased, and any portion of the tubular string 22 may be positioned in an uncased or cased section of the wellbore, in keeping with the principles of this disclosure.

It should be clearly understood, therefore, that this disclosure describes how to make and use certain examples, but the principles of the disclosure are not limited to any details of those examples. Instead, those principles can be applied to a variety of other examples using the knowledge obtained from this disclosure.

It will be appreciated by those skilled in the art that it would be beneficial to be able to regulate flow of the fluids 30 into the tubular string 22 from each zone of the formation 20, for example, to prevent water coning 32 or gas coning 34 in the formation. Other uses for flow regulation in a well include, but are not limited to, balancing production from (or injection into) multiple zones, minimizing production or injection of undesired fluids, maximizing production or injection of desired fluids, etc.

Examples of the variable flow resistance systems 25 described more fully below can provide these benefits by increasing resistance to flow if a fluid velocity increases beyond a selected level (e.g., to thereby balance flow among zones, prevent water or gas coning, etc.), or increasing resistance to flow if a fluid viscosity decreases below a selected level (e.g., to thereby restrict flow of an undesired fluid, such as water or gas, in an oil producing well).

Whether a fluid is a desired or an undesired fluid depends on the purpose of the production or injection operation being conducted. For example, if it is desired to produce oil from a well, but not to produce water or gas, then oil is a desired fluid and water and gas are undesired fluids.

Note that, at downhole temperatures and pressures, hydrocarbon gas can actually be completely or partially in liquid phase. Thus, it should be understood that when the term "gas" is used herein, supercritical, liquid and/or gaseous phases are included within the scope of that term.

Figure 2:
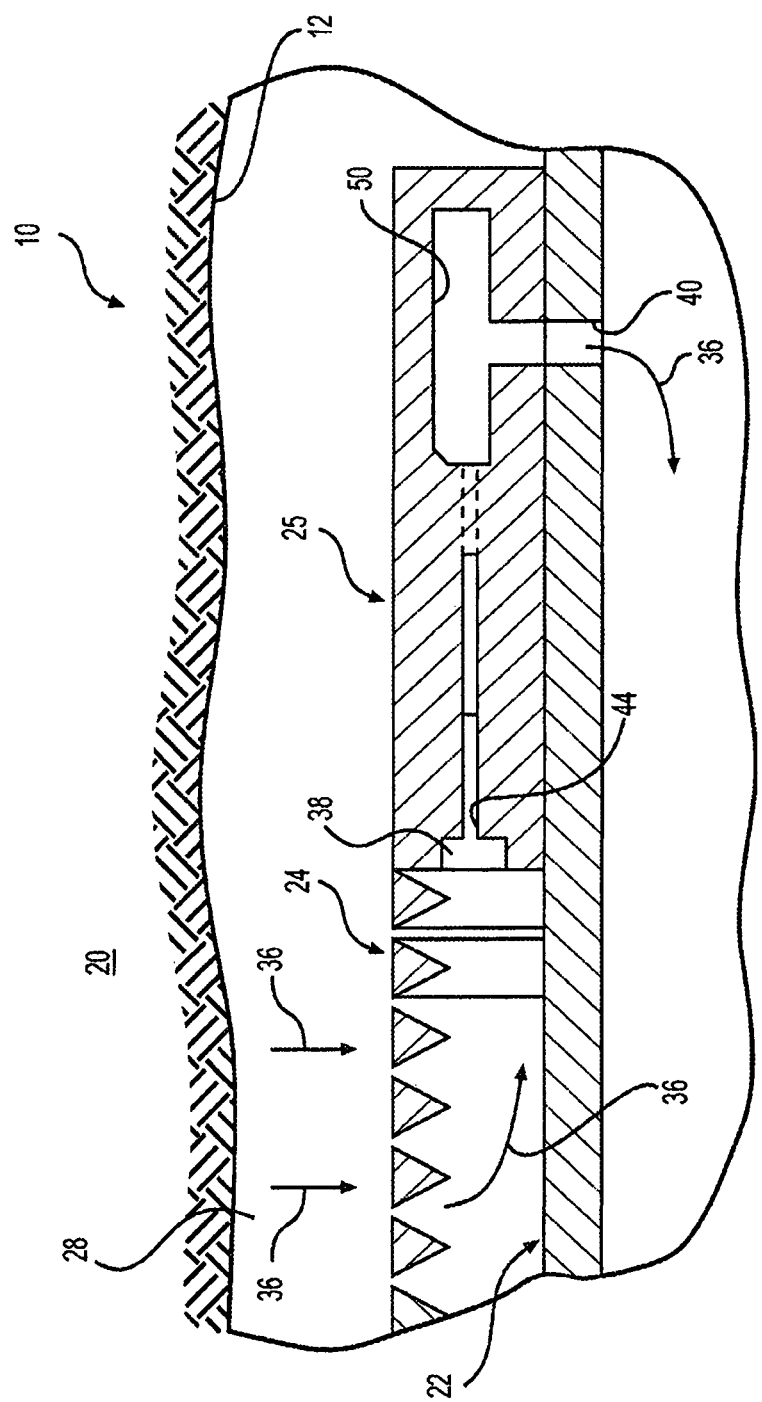
FIG. 2 shows a schematic view of an inflow control device in accordance with one or more embodiments of the present disclosure.

Referring additionally now to FIG. 2, a schematic view of a variable flow resistance system 25 in accordance with one or more embodiments of the present disclosure are shown. In this example, a fluid 36 (which can include one or more fluids, such as oil and water, liquid water and steam, oil and gas, gas and water, oil, water and gas, etc.) may be filtered by a well screen (24 in FIG. 1), and may then flow into an inlet flow path 38 of the variable flow resistance system 25. A fluid can include one or more undesired or desired fluids. Both steam and water can be combined in a fluid. As another example, oil, water and/or gas can be combined in a fluid. Flow of the fluid 36 through the variable flow resistance system 25 is resisted based on one or more characteristics (e.g., viscosity, velocity, etc.) of the fluid. It may be seen that the fluid 36 flows from the inlet flow path 38 and through a fluid passage 44 to intersect a flow chamber 50 of the variable flow resistance system 25. The fluid 36 may then be discharged from the variable flow resistance system 25 to an interior of the tubular string 22 via an outlet flow path 40.

In other examples, the well screen 24 may not be used in conjunction with the variable flow resistance system 25 (e.g., in injection operations), the fluid 36 could flow in an opposite direction through the various elements of the well system 10 (e.g., in injection operations), a single variable flow resistance system could be used in conjunction with multiple well screens, multiple variable flow resistance systems could be used with one or more well screens, the fluid could be received from or discharged into regions of a well other than an annulus or a tubular string, the fluid could flow through the variable flow resistance system prior to flowing through the well screen, any other components could be interconnected upstream or downstream of the well screen and/or variable flow resistance system, etc. Thus, it will be appreciated that the principles of this disclosure are not limited at all to the details of the example depicted in FIG. 2 and described herein. Further, additional components (such as shrouds, shunt tubes, lines, instrumentation, sensors, inflow control devices, etc.) may also be used in accordance with the present disclosure, if desired.

The variable flow resistance system 25 is depicted in simplified form in FIG. 2, but in a preferred example, the system can include various passages and devices for performing various functions, as described more fully below. In addition, the system 25 preferably at least partially extends circumferentially about the tubular string 22, or the system may be formed in a wall of a tubular structure interconnected as part of the tubular string.

In other examples, the system 25 may not extend circumferentially about a tubular string or be formed in a wall of a tubular structure. For example, the system 25 could be formed in a flat structure, etc. The system 25 could be in a separate housing that is attached to the tubular string 22, or it could be oriented so that the axis of the outlet flow path 40 is parallel to the axis of the tubular string. The system 25 could be on a logging string or attached to a device that is not tubular in shape. Any orientation or configuration of the system 25 may be used in keeping with the principles of this disclosure.

Figure 3:
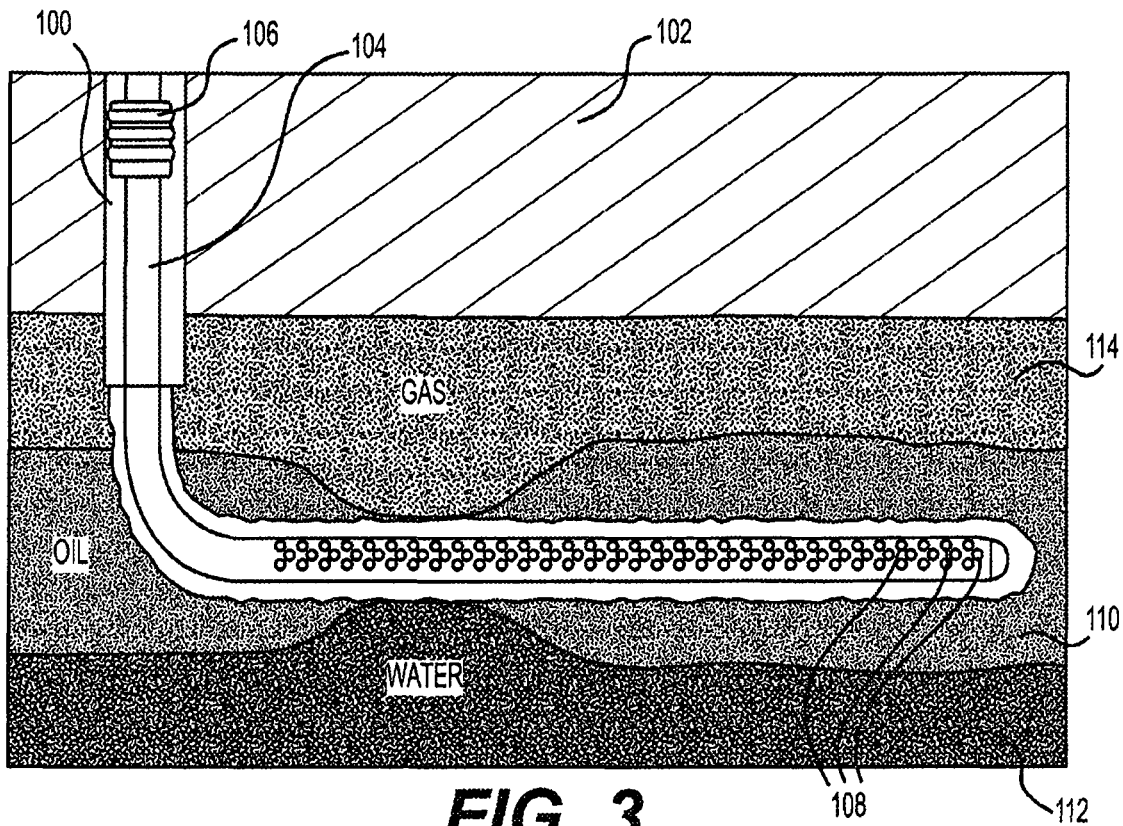
FIG. 3 shows a cross-sectional view of a well extending into a reservoir or formation in accordance with one or more embodiments of the present disclosure.

One or more embodiments of the present disclosure may relate to increasing oil production in or from a well, reducing fluid production in or from a well, and/or optimizing a design of a production tool that includes one or more inflow control devices (e.g., the tubular string 22 including the variable flow resistance systems 25 shown in FIGS. 1 and 2). As used herein, fluid may refer to a liquid and/or a gas, and the liquid may refer to water, chemicals, oil, and/or any other type of fluid found within, introduced into, and/or produced from a well. FIG. 3 shows a cross-sectional view of a well 100 extending into a reservoir 102 or formation in accordance with one or more embodiments of the present disclosure. The well 100 has a production tool 104 positioned therein, in which the production tool 104 includes a packer 106 and one or more inflow control devices 108. The inflow control devices 108 may be used to control and facilitate the production of fluid (e.g., oil, water, and/or gas) from the reservoir 102, into the well 100, and then into the production tool 104. As shown in this example, the reservoir 102 includes a layer 110 or portion that is saturated with oil, includes a layer 112 or portion below the layer 110 that is saturated with water (e.g., from an aquifer), and includes a layer 114 or portion above the layer 110 that is saturated with gas.

Due to the inhomogeneity of the properties of the reservoir 102 and the drop of pressure inside the well 100, the ratio of the volume of water produced to the volume of overall fluid produced (e.g., water cut) can vary and be uneven for the production tool 104 along the axial direction of the well 100. For example, in FIG. 3, it is shown that the water-saturated layer 112 rises and infiltrates into and towards the oil-saturated layer 110 such that the water-saturated layer 112 may intersect the well 100. In such an embodiment, the water content from the fluid produced from this portion of the well 100 will be higher compared to the other portions of the well 100.

Figure 4:
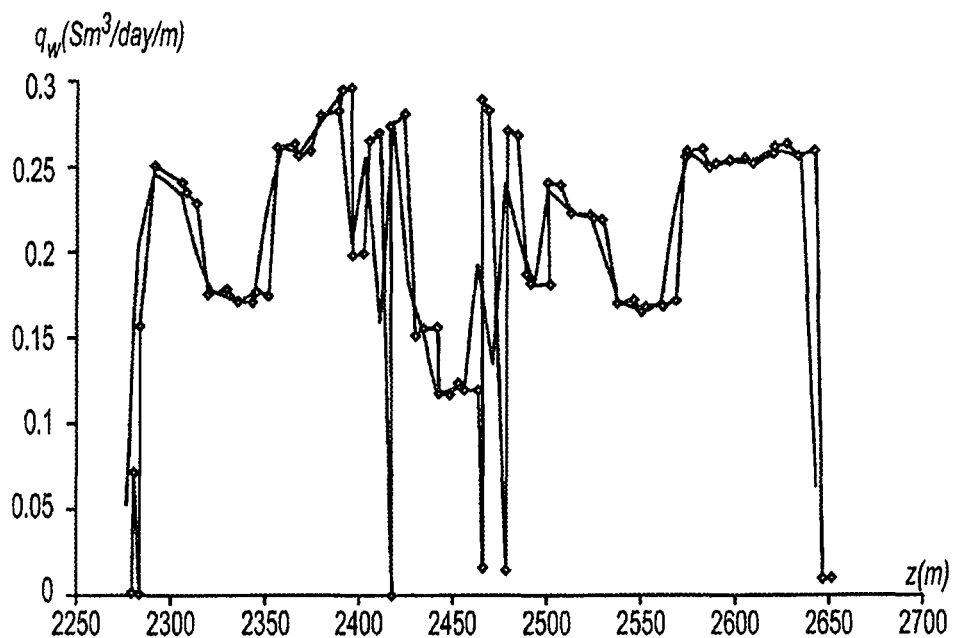
FIG. 4 shows a graph of water production (y-axis) from an inhomogeneous reservoir versus axial positions (x-axis) of inflow control devices for a production tool positioned in a well of the reservoir in accordance with one or more embodiments of the present disclosure.

FIG. 4 shows a graph of water production (y-axis) from an inhomogeneous reservoir versus axial positions (x-axis) of inflow control devices for a production tool positioned in a well of the reservoir. The inflow control devices included with the production tool in FIG. 4 may each have about the same nozzle diameter of about 3 mm in this embodiment (e.g., $D_{or}$=3 mm). Accordingly, due to the inhomogeneous properties of the reservoir, the inflow control devices have a significant variance with respect to the water cut or the amount of water produced by each respective inflow control device. For example, the inflow control devices positioned at about the 2400 m position and the 2475 m position in FIG. 4 produce water at a flow rate more than double compared with that of the inflow control devices positioned at about the 2450 m position.

Accordingly, one or more embodiments of the present disclosure may relate to increasing oil production in or from a well, reducing fluid production in or from a well, and/or optimizing a design of a production tool that includes one or more inflow control devices (e.g., the tubular string 22 including the variable flow resistance systems 25 shown in FIGS. 1 and 2). For example, in accordance with one or more embodiments of the present disclosure, one or more parameters for the inflow control devices of a production tool may be optimized based upon the properties of a reservoir or well. The parameters may be optimized to reduce the water production from the well and through the inflow control devices, which may lead to an increase in the oil produced from the well and through the inflow control devices.

Figure 5:
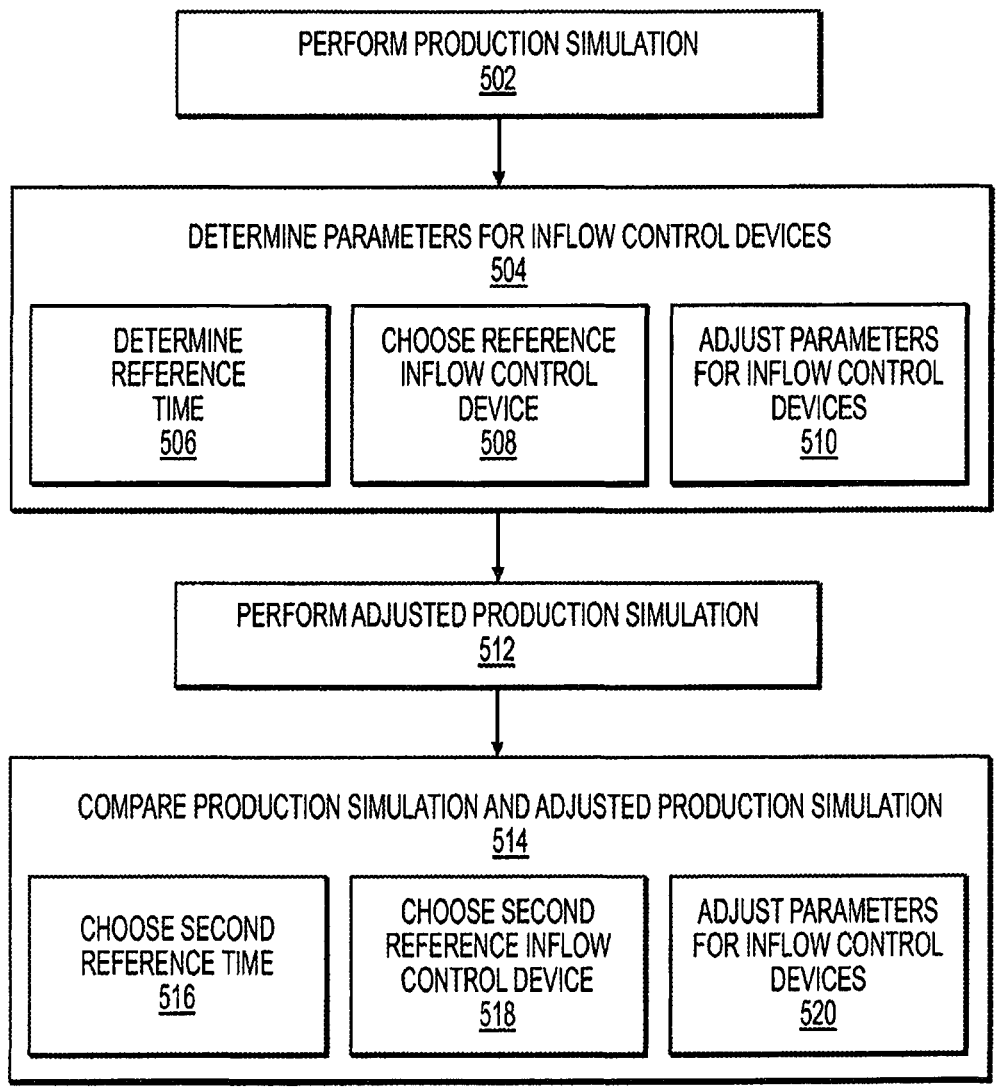
FIG. 5 is a flow diagram of an illustrative method or process to reduce water production in a well, to increase oil production in a well, and/or to design a production tool including one or more inflow control devices in accordance with one or more embodiments of the present disclosure.

FIG. 5 is a flow diagram of an illustrative method or process to reduce water production in a well, to increase oil production in a well, and/or to design a production tool including one or more inflow control devices in accordance with one or more embodiments of the present disclosure. This method includes performing a production simulation of a reservoir model that includes a production tool with one or more inflow control devices 502. The reservoir model may have properties similar to that of a known reservoir or well such that the production tool with the inflow control devices may be optimized or tailored for use with the known reservoir or well. One or more simulators, such as Netool and/or Quiklook, may be used to simulate the production from a reservoir model, such as for an expected lifetime of the well.

The mass flow rate of fluid through an individual inflow control device may be described by the below equations:

$$J = \frac{1}{4}\pi C (D_{or}^0)^2 \sqrt{2\rho_i f(z)(p^e - p^i)}; \quad p_{in} = p_{in}^e \quad \text{Equation (1)}$$

$$f(z) = \left(\frac{D_{or}}{D_{or}^0}\right)^4 \quad \text{Equation (2)}$$

In Equations (1) and (2), J is the mass flow rate, z is the axial coordinate along the well, $\rho_i$ is the fluid density and average flow velocity, $D_{or}$ and $D_{or}^0$ are the diameter for the nozzle of the inflow control device and a reference value for the diameter for the nozzle of the inflow control device, $p^e$ and $p^i$ are the flow pressure outside and inside of the well, and C is the orifice flow coefficient. If an inflow control device includes more than one nozzle, $D_{or}$ may equal the equivalent nozzle diameter for the inflow control device. Equations (1) and (2) may be considered as a hydrodynamic condition on the interface between the reservoir and the well, with function $f(z)$ fully characterizing the distribution of the inflow control device diameters in the production zone of the well. If the distribution function $f(z)$ is known, the distribution of equivalent nozzle diameters may be calculated using the below equation:

$$D_{or}(z) = D_{or}^0 f^{0.25}(z) \quad \text{Equation (3)}$$

Consider a function $w(z)$ that characterizes the fluid distribution along the well, such as the water cut profile or a production flow rate of water sometime after the start of production in the well. Increasing the inflow control device nozzle size will lead to an increase of $w(z)$ in the corresponding point z. Further, based on some considerations, an optimized or desired final shape for the function $w(z)$ may be $\Phi(z)$. For example, in the case that uniform water distribution is needed, $\Phi(z)=1$ for all points z along the length of the well. This may be achieved by tuning or adjusting the distribution function $f(z)$ according to one or more embodiments of the present disclosure. Accordingly, when performing the production simulation of the reservoir model, $f(z)=1$ may be assumed for all points z along the well length, at least initially, which may be equivalent to assuming that the nozzle diameter for the inflow control devices is equal to $D_{or}$ for all points z along the well length.

The method further includes determining or adjusting a parameter for the one or more inflow control devices of the production tool to reduce fluid production through the inflow control devices based upon the production simulation 504. For example, as discussed above, a parameter for an inflow control device that may be determined or adjusted may include a size of a nozzle of the inflow control device, in which the size (e.g., diameter or area) of the nozzle may be adjusted to reduce fluid production through the inflow control device based upon the production simulation. Other parameters that may be adjusted or determined may also include, but are not limited to, a number of nozzles of the inflow control device, such as increasing or decreasing the number of nozzles included within an inflow control device, and/or a location of the nozzle or the inflow control device, such as moving a nozzle of an inflow control device.

The determining the parameters for the inflow control devices 504 may include one or more steps, as shown in FIG. 5. For example, the determining the parameters for the inflow control devices 504 may include one or more of the following: determining a reference time from the production simulation where fluid production is above a predetermined level for a majority of the inflow control devices of the production tool 506; choosing a reference inflow control device from the inflow control devices with a maximum allowable fluid production at the reference time 508; and adjusting, with respect to the reference inflow control device, parameters for the inflow control devices with fluid production above the maximum allowable fluid production 510.

When determining a reference time 506, the production simulation of the reservoir model may be performed until the fluid (e.g., water cut, ratio of water production to volume of overall fluid production) is above a predetermined level (e.g., 0.1) for most of the well or for the majority of the inflow control devices. The reference time, $t_0$, may then be determined once most of the well or the majority of the inflow control devices are above the predetermined level. An example of a reference time, $t_0$, may be about 100 days or about 150 days of simulated production of the reservoir model.

Using the reference time, the profiles of the function $w(z)$ may be calculated to characterize the fluid distribution along the well (e.g., the water cut profile or the production flow rate of water at the reference time, $t_0$). From here, a reference inflow control device, $z_0$, may be chosen, found, or determined 508 from the water cut profiles for the inflow control devices at the reference time. In particular, the production simulation may be reviewed to determine a maximum allowable fluid production for the inflow control devices at the reference time (e.g., a maximum allowable water production ratio of about 0.1 water production to volume of overall fluid production), and a reference inflow control device, $z_0$, at or below the maximum allowable fluid production may then be chosen, found, or determined. Another example may be choosing a reference inflow control device with a minimum allowable ration of $w(z)/\Phi(z)$.

Based upon the reference inflow control device, $z_0$, parameters for the inflow control devices of the production tool in the reservoir model with fluid production above the maximum allowable fluid production may be adjusted 510. For example, with respect to the parameter of the size or diameter of a nozzle diameter, the inflow control devices with fluid production above the maximum allowable fluid production may have nozzles that are reduced in size (e.g., diameter reduced) such that water and fluid produced through the nozzle of the inflow control device is reduced. In another embodiment, the parameters for the inflow control devices with fluid production above the maximum allowable fluid production may be adjusted to have substantially the same fluid production as each of the other adjusted inflow control devices and/or the reference inflow control device. In such an embodiment, the inflow control devices may be adjusted such that fluid production through each inflow control device is substantially the same in the reservoir model, such as at the reference time.

When adjusting the parameters for the inflow control devices 510, the distribution function $f(z)$ may be modified or corrected, such as according to the following equation:

$$f^{n+1}(z) = f^n(z)\left[\frac{w(z_0)}{w(z)}\frac{\Phi(z)}{\Phi(z_0)}\right]^m \qquad \text{Equation (4)}$$

In Equation (4), n is the iteration number and m is the exponent, which depend on the property characterized by the function $w(z)$. Once the distribution function $f(z)$ is modified or corrected, the convergence of the function $f(z)$ is checked or verified using the following equation, where $\varepsilon$ is a small number:

$$\max|f^{n+1}(z) - f^n(z)| < \varepsilon \qquad \text{Equation (5)}$$

If the convergence and condition of Equation (5) is not solved or fulfilled, the method may revert back to setting the parameters of the inflow control devices, such as shown in Equation (3) above. The production simulation of the reservoir model may then be performed to the reference time, $t_0$, with the distribution function $f(z)$ modified or corrected, as shown above, such that the method has an iterative portion when adjusting the parameters for the inflow control devices. If the convergence and condition of Equation (5) is solved or fulfilled, and knowing that the function $f(z) = f^{n+1}(z)$, the adjusted parameters for the inflow control devices are also calculated using Equation (3) above.

Following the determining the parameters for the inflow control devices 504, the method further includes performing an adjusted production simulation of the reservoir model that includes the production tool with the inflow control devices including the adjusted parameters 512. The production simulation and the adjusted production simulation may then be compared with each other to determine if fluid production is reduced for the adjusted production simulation that includes the adjusted parameters for the inflow control devices 514.

If the fluid production in the adjusted production simulation has sufficiently decreased or the oil production in the adjusted production simulation has sufficiently increased, then the method may be completed and the adjusted parameters of the inflow control devices may be used within a production tool for a well or reservoir represented by the reservoir model and the production simulation. If the fluid production in the adjusted production simulation has not sufficiently decreased or the oil production in the adjusted production simulation has not sufficiently increased, then, in one embodiment, a second reference time may be chosen that is later than the first reference time from the production simulation 516, thereby increasing the simulated length of the production simulation.

Using the second reference time, the profiles of the function $w(z)$ may be calculated to characterize the fluid distribution along the well (e.g., the water cut profile or the production flow rate of fluid at the second reference time). From here, a second reference inflow control device may be chosen, found, or determined 518 from the water cut profiles for the inflow control devices at the reference time. In particular, the production simulation may be reviewed to determine a second maximum allowable fluid production for the inflow control devices at the second reference time, and a second reference inflow control device at or below the maximum allowable fluid production may then be chosen, found, or determined.

Based upon the second reference inflow control device, parameters for the inflow control devices of the production tool in the reservoir model with fluid production above the second maximum allowable fluid production may be adjusted 520. For example, with respect to the parameter of the size or diameter of a nozzle diameter, the inflow control devices with fluid production above the second maximum allowable fluid production may have nozzles that are reduced in size (e.g., diameter reduced) such that water and fluid produced through the nozzle of the inflow control device is reduced. In another embodiment, the parameters for the inflow control devices with fluid production above the second maximum allowable fluid production may be adjusted to have substantially the same fluid production as each of the other adjusted inflow control devices and/or the reference inflow control device. In such an embodiment, the inflow control devices may be adjusted such that fluid production through each inflow control device is substantially the same in the reservoir model, such as at the second reference time.

Figure 6:
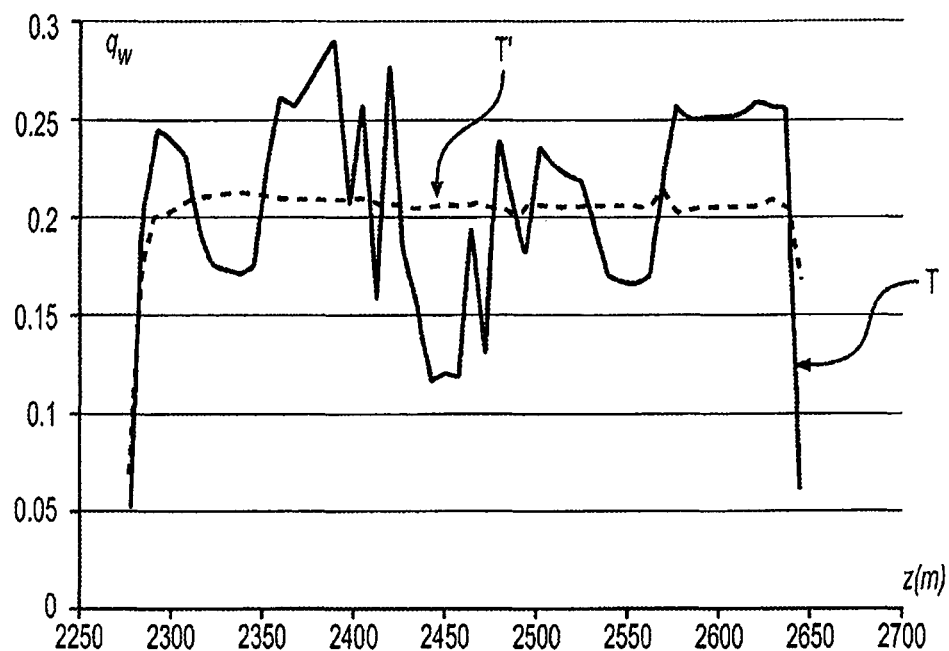
FIG. 6 shows a graph of water production (y-axis) from an inhomogeneous reservoir versus axial positions (x-axis) of inflow control devices for the production tool positioned in a well of the reservoir in accordance with one or more embodiments of the present disclosure.
Figure 7:
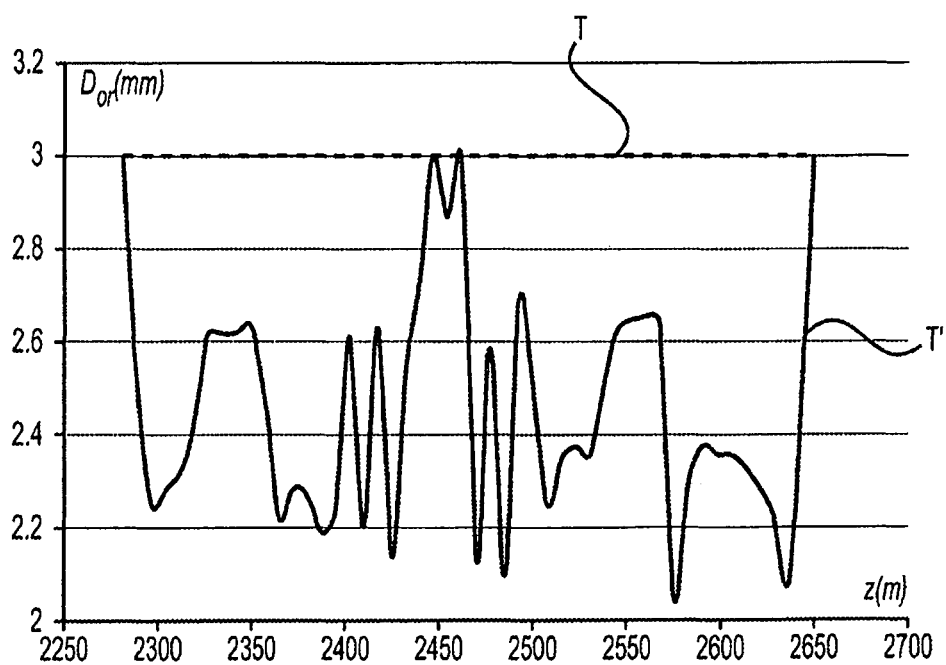
FIG. 7 shows a graph of nozzle diameter size of the inflow control devices (y-axis) of the production tools versus axial positions (x-axis) of inflow control devices for the production tool positioned in a well of the reservoir in accordance with one or more embodiments of the present disclosure.

Referring now to FIGS. 6 and 7, multiple graphs are shown comparing a production tool with inflow control devices having no adjusted parameters (e.g., the original production tool, represented by T) and a production tool with inflow control devices having parameters adjusted (the adjusted production tool, represented by T') in accordance with the present disclosure. FIG. 6 shows a graph of fluid production (y-axis) from an inhomogeneous reservoir versus axial positions (x-axis) of inflow control devices for the production tool positioned in a well of the reservoir. Further, FIG. 7 shows a graph of nozzle diameter size of the inflow control devices (y-axis) of the production tools versus axial positions (x-axis) of inflow control devices for the production tool positioned in a well of the reservoir.

As shown in FIGS. 6 and 7, the inflow control devices included with the original production tool T may each have about the same nozzle diameter of about 3 mm in this embodiment (e.g., $D_{or}$=3 mm). Accordingly, due to the inhomogeneous properties of the reservoir, the inflow control devices for the original production tool T have a significant variance with respect to the water cut or the amount of fluid produced by each respective inflow control device. The inflow control devices for the adjusted production tool T' may then have the parameters adjusted in accordance with one or more embodiments of the present disclosure.

As shown in FIG. 7 for the adjusted production tool T', the inflow control devices may each have an adjusted nozzle diameter that, in this embodiment, varies between about 2 mm and 3 mm. As the nozzle diameter is adjusted based upon the expected fluid production through the inflow control device, one can see in a comparison of FIGS. 6 and 7 that the inflow control devices with the lowest expected fluid production have the largest nozzle diameter (e.g., the inflow control devices positioned at about the 2450 m position produce the least amount of water with a water cut of about 0.12, and therefore when adjusted have the largest nozzle diameter at about 3 mm). The reciprocal may also be true in that the inflow control devices with the highest expected fluid production have the smallest nozzle diameter (e.g., the inflow control devices positioned at about the 2400 m position and the 2575 m produce the most amount of fluid with a water cut of about 0.25, and therefore when adjusted have the smallest nozzle diameter at about 2 to 2.2 mm). Accordingly, as shown in FIG. 6 for the adjusted production tool T', the inflow control devices may each have the parameters adjusted such that each inflow control device may have substantially the same amount of fluid production.

Figure 8:
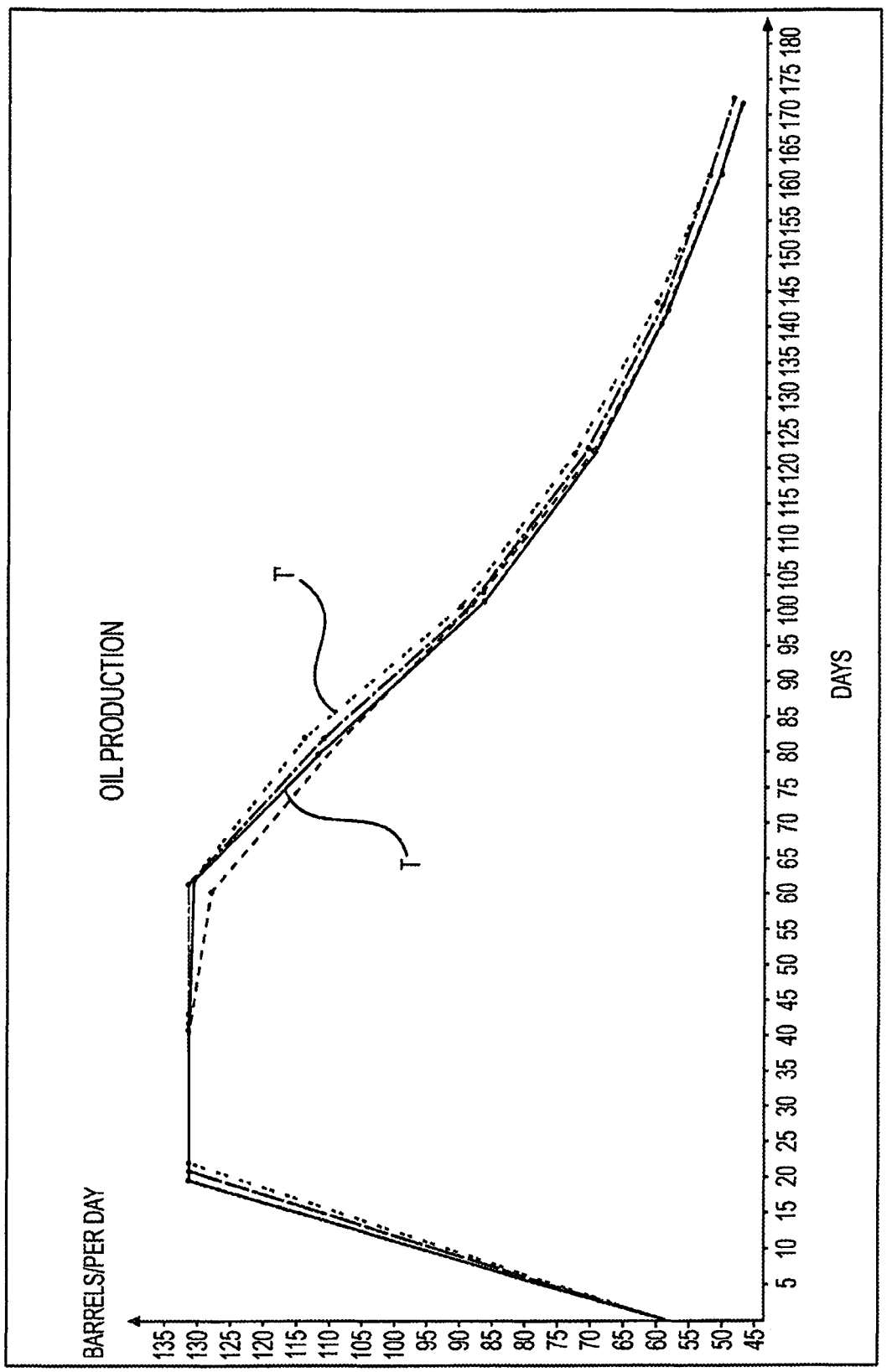
FIG. 8 shows a graph of oil production (y-axis) from an inhomogeneous reservoir versus time (number of days of production) for production tools positioned in a well of the reservoir in accordance with one or more embodiments of the present disclosure.

FIG. 8 shows a graph of oil production (y-axis) from an inhomogeneous reservoir versus time (number of days of production) for production tools positioned in a well of the reservoir in accordance with one or more embodiments of the present disclosure. In particular, the oil production for the original production tool T and for the adjusted production tool T' are shown versus time. As shown starting at about day 65 in the graph, the adjusted production tool T' begins to outperform the original production tool T, and this trend is shown to continue for the expected life of the well or reservoir. Accordingly, in one or more embodiments, a method and/or system in accordance with the present disclosure may result in an overall increase in oil production for a production tool used within a well.

Figure 9:
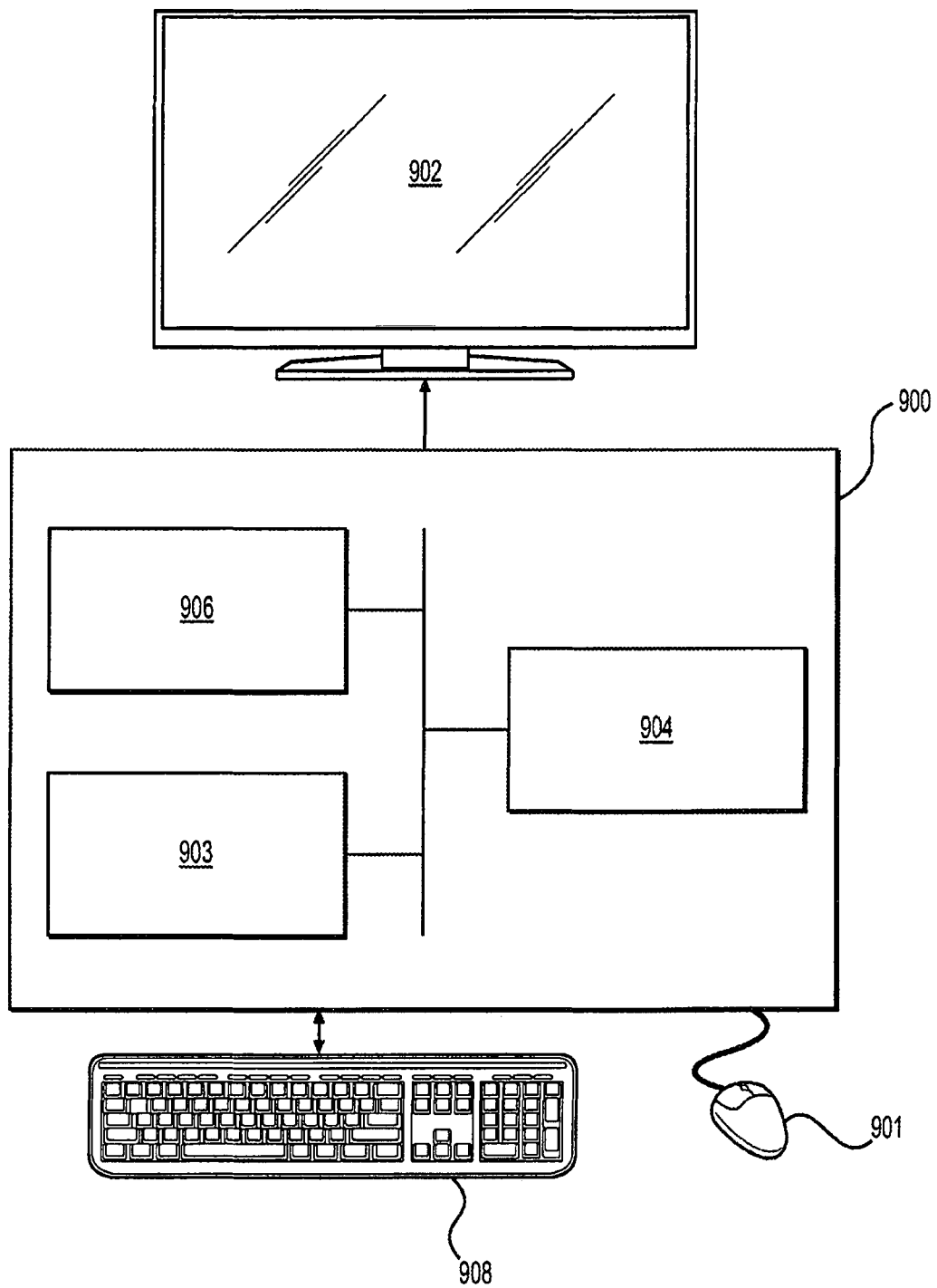
FIG. 9 shows a general purpose computer that may be used with embodiments of the present disclosure.

Some embodiments of the present disclosure relate to systems for performing the above-described methods to reduce fluid production in a well. A system in accordance with embodiments of the present disclosure may be implemented on a stand-alone computer. FIG. 9 shows a general purpose computer that may be used with embodiments of the present disclosure.

Referring now to FIG. 9, a general computer system may include a main unit 900, a display 902 and input devices such as a keyboard 908 and a mouse 901. The main unit 900 may include a central processor unit 904, a permanent memory (e.g., a hard disk) 903, and a random access memory 906. The memory 903 may include a program that includes instructions for performing the methods of the invention. A program may be embodied on any computer retrievable medium, such as a hard disk, a diskette, a CD-ROM, or any other medium known or yet to be developed. The programming may be accomplished with any programming language and the instructions may be in a form of a source codes that may need compilation before the computer can execute the instructions or in a compiled (binary) or semi-compiled codes. The precise form and medium the program is on are not germane to the present disclosure and should not limit the scope of the present disclosure.

In addition to the embodiments described above, many examples of specific combinations are within the scope of the disclosure, some of which are detailed below:

EXAMPLE 1

A method to reduce fluid production in a well, the method comprising: performing a production simulation of a reservoir model comprising a production tool with an inflow control device; and determining a parameter for the inflow control device to reduce fluid production through the inflow control device based upon the production simulation.

EXAMPLE 2

The method of Example 1, wherein the parameter comprises at least one of a size of a nozzle of the inflow control device, a number of nozzles of the inflow control device, and a location of the inflow control device on the production tool.

EXAMPLE 3

The method of Example 1, wherein the production tool comprises a plurality of inflow control devices.

EXAMPLE 4

The method of Example 3, wherein the determining the parameter for the inflow control device comprises:

determining a reference time from the production simulation where fluid production is above a predetermined level for a majority of the plurality of inflow control devices;

choosing a reference inflow control device from the plurality of inflow control devices with a maximum allowable fluid production at the reference time; and adjusting, with respect to the reference inflow control device, parameters for the plurality of inflow control devices with fluid production above the maximum allowable fluid production.

EXAMPLE 5

The method of Example 4, wherein the adjusting parameters for the plurality of inflow control devices comprises reducing a size of a nozzle for the plurality of inflow control devices.

EXAMPLE 6

The method of Example 4, wherein the adjusting parameters for the plurality of inflow control devices comprises adjusting the parameters for the plurality of inflow control devices such that fluid production through the plurality of inflow control devices is substantially the same for the production simulation.

EXAMPLE 7

The method of Example 4, further comprising:

performing an adjusted production simulation of the reservoir model comprising the production tool with the plurality of inflow control devices comprising the adjusted parameters; and comparing the production simulation with the adjusted production simulation of the reservoir model to determine if fluid production is reduced for the adjusted production simulation.

EXAMPLE 8

The method of Example 7, wherein, if fluid production is not reduced for the adjusted production simulation, the method further comprising: choosing a second reference time later than the first reference time from the production simulation;

choosing a second reference inflow control device from the plurality of inflow control devices with a second maximum allowable fluid production at the second reference time; and adjusting, with respect to the second reference inflow control device, the parameters for the plurality of inflow control devices with the production of fluid above the second maximum allowable fluid production.

EXAMPLE 9

The method of Example 4, wherein the maximum allowable fluid production is a ratio of about 0.1 fluid production to volume of overall fluid production.

EXAMPLE 10

The method of Example 4, wherein the reference time is more than about 100 days, and wherein the predetermined level for fluid production is a ratio of about 0.1 water production to volume of overall fluid production.

EXAMPLE 11

A system to reduce fluid production in a well, the system comprising the production tool, a processor, and a memory, wherein the memory stores a program comprising instructions for:

performing a production simulation of a reservoir model comprising the production tool with an inflow control device; and determining the parameter for the inflow control device to reduce fluid production through the inflow control device based upon the production simulation.

EXAMPLE 12

The system of Example 11, wherein the parameter comprises at least one of a size of a nozzle of the inflow control device, a number of nozzles of the inflow control device, and a location of the inflow control device on the tool.

EXAMPLE 13

The system of Example 11, wherein the production tool comprises a plurality of inflow control devices.

EXAMPLE 14

The system of Example 13, wherein the determining the parameter for the inflow control device comprises:

determining a reference time from the production simulation where fluid production is above a predetermined level for a majority of the plurality of inflow control devices;

choosing a reference inflow control device from the plurality of inflow control devices with a maximum allowable fluid production at the reference time; and adjusting, with respect to the reference inflow control device, parameters for the plurality of inflow control devices with fluid production above the maximum allowable fluid production.

EXAMPLE 15

The system of Example 14, wherein the adjusting parameters for the plurality of inflow control devices comprises adjusting the parameters for the plurality of inflow control devices such that fluid production through the plurality of inflow control devices is substantially the same for the production simulation.

EXAMPLE 16

The system of Example 14, further comprising:

performing an adjusted production simulation of the reservoir model comprising the production tool with the plurality of inflow control devices comprising the adjusted parameters;

comparing the production simulation with the adjusted production simulation of the reservoir model to determine if fluid production is reduced for the adjusted production simulation;

wherein, if fluid production is not reduced for the adjusted production simulation, the method further comprising:

choosing a second reference time later than the first reference time from the production simulation;

choosing a second reference inflow control device from the plurality of inflow control devices with a second maximum allowable fluid production at the second reference time; and adjusting, with respect to the second reference inflow control device, the parameters for the plurality of inflow control devices with the production of fluid above the second maximum allowable fluid production.

EXAMPLE 17

A method to reduce fluid production in a well, the method comprising: performing a production simulation of a reservoir model comprising a production tool with a plurality of inflow control devices for an expected lifetime of the well; determining a reference time from the production simulation where fluid production is above a predetermined level for a majority of the plurality of inflow control devices;

choosing a reference inflow control device from the plurality of inflow control devices with a maximum allowable fluid production at the reference time; and adjusting, with respect to the reference inflow control device, parameters for the plurality of inflow control devices with fluid production above the maximum allowable fluid production.

EXAMPLE 18

The method of Example 17, wherein the adjusting parameters for the plurality of inflow control devices comprises reducing a size of a nozzle for the plurality of inflow control devices.

EXAMPLE 19

The method of Example 17, further comprising:
performing an adjusted production simulation of the reservoir model comprising the production tool with the plurality of inflow control devices comprising the adjusted parameters for the expected lifetime of the well; and
comparing the production simulation with the adjusted production simulation of the reservoir model to determine if fluid production is reduced for the adjusted production simulation.

EXAMPLE 20

The method of Example 19, wherein, if fluid production is not reduced for the adjusted production simulation, the method further comprising:
choosing a second reference time later than the first reference time from the production simulation;
choosing a second reference inflow control device from the plurality of inflow control devices with a second maximum allowable fluid production at the second reference time; and
adjusting, with respect to the second reference inflow control device, the parameters for the plurality of inflow control devices with the production of fluid above the second maximum allowable fluid production.

This discussion is directed to various embodiments of the invention. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to intimate that the scope of the disclosure, including the claims, is limited to that embodiment.

Certain terms are used throughout the description and claims to refer to particular features or components. As one skilled in the art will appreciate, different persons may refer to the same feature or component by different names. This document does not intend to distinguish between components or features that differ in name but not function, unless specifically stated. In the discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. The use of "top," "bottom," "above," "below," and variations of these terms is made for convenience, but does not require any particular orientation of the components.

Reference throughout this specification to "one embodiment," "an embodiment," or similar language means that a particular feature, structure, or characteristic described in connection with the embodiment may be included in at least one embodiment of the present disclosure. Thus, appearances of the phrases "in one embodiment," "in an embodiment," and similar language throughout this specification may, but do not necessarily, all refer to the same embodiment.

Although the present invention has been described with respect to specific details, it is not intended that such details should be regarded as limitations on the scope of the invention, except to the extent that they are included in the accompanying claims.

What is claimed is:

1. A method to reduce fluid production in a well, the method comprising:
performing a production simulation of a reservoir model comprising a production tool with an inflow control device of a plurality of inflow control devices; and
determining a parameter for the inflow control device to reduce fluid production through the inflow control device based upon the production simulation, wherein the determining the parameter for the inflow control device comprises:
determining a reference time from the production simulation where fluid production is above a predetermined level for a majority of the plurality of inflow control devices;
choosing a reference inflow control device from the plurality of inflow control devices comprising a maximum allowable fluid production at the reference time, the maximum allowable fluid production being a ratio of a volume of water production to volume of overall fluid production; and
adjusting, with respect to the reference inflow control device, at least one parameter for the plurality of inflow control devices with fluid production above the maximum allowable fluid production.

2. The method of claim 1, wherein the parameter comprises at least one of a size of a nozzle of the inflow control device, a number of nozzles of the inflow control device, and a location of the inflow control device.

3. The method of claim 1, wherein adjusting the at least one parameter for the plurality of inflow control devices comprises reducing a size of a nozzle for the plurality of inflow control devices.

4. The method of claim 1, wherein the adjusting at least one parameter for the plurality of inflow control devices comprises adjusting the at least one parameter for the plurality of inflow control devices such that fluid production through each of the plurality of inflow control devices is substantially the same.

5. The method of claim 1, further comprising: performing an adjusted production simulation of the reservoir model comprising the production tool with the plurality of inflow control devices comprising the adjusted parameters; and comparing the production simulation with the adjusted production simulation of the reservoir model to determine if fluid production is reduced for the adjusted production simulation.

6. The method of claim 5, wherein, if fluid production is not reduced for the adjusted production simulation, the method further comprising:
choosing a second reference time later than the first reference time from the production simulation;
choosing a second reference inflow control device from the plurality of inflow control devices comprising a second maximum allowable fluid production at the second reference time; and adjusting, with respect to the second reference inflow control device, the at least one parameter for the plurality of inflow control devices with the production of fluid above the second maximum allowable fluid production.

7. The method of claim 1, wherein the maximum allowable fluid production is a ratio of about 0.1 water production to volume of overall fluid production.

8. The method of claim 1, wherein the reference time is more than about 100 days, and wherein the predetermined level for fluid production is a ratio of about 0.1 water production to volume of overall fluid production.

9. A system to reduce fluid production in a well, the system comprising a production tool, a processor, and a memory, wherein the memory stores a program comprising instructions for:
performing a production simulation of a reservoir model comprising the production tool with an inflow control device of a plurality of inflow control devices; and
determining a parameter for the inflow control device to reduce fluid production through the inflow control device based upon the production simulation, wherein the determining the parameter for the inflow control device comprises;
determining a reference time from the production simulation where fluid production is above a predetermined level for a majority of the plurality of inflow control devices;
choosing a reference inflow control device from the plurality of inflow control devices comprising a maximum allowable fluid production at the reference time, the maximum allowable fluid production being a ratio of a volume of water production to volume of overall fluid production; and
adjusting, with respect to the reference inflow control device, at least one parameter for the plurality of inflow control devices with fluid production above the maximum allowable fluid production.

10. The system of claim 9, wherein the parameter comprises at least one of a size of a nozzle of the inflow control device, a number of nozzles of the inflow control device, and a location of the inflow control device.

11. The system of claim 9, wherein adjusting the at least one parameter for the plurality of inflow control devices comprises adjusting the at least one parameter for the plurality of inflow control devices such that fluid production through each of the plurality of inflow control devices is substantially the same.

12. The system of claim 9, further comprising:
performing an adjusted production simulation of the reservoir model comprising the production tool with the plurality of inflow control devices comprising the adjusted parameters;
comparing the production simulation with the adjusted production simulation of the reservoir model to determine if fluid production is reduced for the adjusted production simulation;
wherein, if fluid production is not reduced for the adjusted production simulation, the method further comprising:
choosing a second reference time later than the first reference time from the production simulation;
choosing a second reference inflow control device from the plurality of inflow control devices comprising a second maximum allowable fluid production at the second reference time; and
adjusting, with respect to the second reference inflow control device, the at least one parameter for the plurality of inflow control devices with the production of fluid above the second maximum allowable fluid production.

13. A method to reduce fluid production in a well, the method comprising:
performing a production simulation of a reservoir model comprising a production tool with a plurality of inflow control devices for an expected lifetime of the well;
determining a reference time from the production simulation where fluid production is above a predetermined level for a majority of the plurality of inflow control devices;
choosing a reference inflow control device from the plurality of inflow control devices comprising a maximum allowable fluid production at the reference time, the maximum allowable fluid production being a ratio of a volume of water production to volume of overall fluid production; and
adjusting, with respect to the reference inflow control device, at least one parameter for the plurality of inflow control devices with fluid production above the maximum allowable fluid production.

14. The method of claim 13, wherein adjusting the at least one parameter for the plurality of inflow control devices comprises reducing a size of a nozzle for the plurality of inflow control devices.

15. The method of claim 13, further comprising:
performing an adjusted production simulation of the reservoir model comprising the production tool with the plurality of inflow control devices comprising the adjusted parameters for the expected lifetime of the well; and
comparing the production simulation with the adjusted production simulation of the reservoir model to determine if fluid production is reduced for the adjusted production simulation.

16. The method of claim 15, wherein, if fluid production is not reduced for the adjusted production simulation, the method further comprising:
choosing a second reference time later than the first reference time from the production simulation;
choosing a second reference inflow control device from the plurality of inflow control devices comprising a second maximum allowable fluid production at the second reference time; and
adjusting, with respect to the second reference inflow control device, the at least one parameter for the plurality of inflow control devices with the production of fluid above the second maximum allowable fluid production.

* * * * *